United States Patent
Huang et al.

(10) Patent No.: US 11,132,951 B2
(45) Date of Patent: Sep. 28, 2021

(54) PIXEL CIRCUIT, PIXEL DRIVING METHOD AND DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Yinglong Huang, Beijing (CN); Bingwei Yang, Beijing (CN); Wenbao Gao, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/759,939

(22) PCT Filed: Oct. 14, 2019

(86) PCT No.: PCT/CN2019/111022
§ 371 (c)(1),
(2) Date: Apr. 28, 2020

(87) PCT Pub. No.: WO2020/114086
PCT Pub. Date: Jun. 11, 2020

(65) Prior Publication Data
US 2021/0074213 A1     Mar. 11, 2021

(30) Foreign Application Priority Data

Dec. 5, 2018 (CN) .......................... 201811479299.8

(51) Int. Cl.
*G09G 3/3258* (2016.01)
*H01L 27/32* (2006.01)

(52) U.S. Cl.
CPC ..... *G09G 3/3258* (2013.01); *G09G 2300/0426* (2013.01); *G09G 2320/0257* (2013.01); *H01L 27/3276* (2013.01)

(58) Field of Classification Search
None
See application file for complete search history.

(56) References Cited

U.S. PATENT DOCUMENTS 8,648,848 B2 * 2/2014 Tsai ..................... G09G 3/3233
                                                                345/212
8,994,619 B2    3/2015 Jeong
(Continued)

FOREIGN PATENT DOCUMENTS

CN       102568374 A    7/2012
CN       104575377 A    4/2015
(Continued)

OTHER PUBLICATIONS

Office Action of CN Application No. 201811479299.8 and English translation, dated Dec. 30, 2019, 27 pages.
(Continued)

*Primary Examiner* — Duane N Taylor, Jr.
(74) *Attorney, Agent, or Firm* — Muncy, Geissler, Olds & Lowe, P.C.

(57) ABSTRACT

A pixel circuit, a pixel driving method and a display device are provided. The pixel circuit includes a light-emitting element, a driving unit, a light-emitting control unit, a driving control unit, an energy storage unit, a first reset unit and a second reset unit, the first reset unit is configured to write a first voltage output by a first voltage line into a first terminal of the driving unit under control of the reset control line; the second reset unit is configured to write an initial voltage output by an initial voltage line into a control terminal of the driving unit under control of the reset control line; the driving unit is configured to drive the light-emitting (Continued)

element to emit light under control of the control terminal of the driving unit.

20 Claims, 4 Drawing Sheets

(56) References Cited

U.S. PATENT DOCUMENTS

| | | |
|---|---|---|
| 2008/0150846 A1 | 6/2008 | Chung |
| 2010/0007649 A1 | 1/2010 | Tanikame et al. |
| 2012/0147060 A1 | 6/2012 | Jeong |
| 2016/0133191 A1 | 5/2016 | Kang et al. |
| 2018/0090071 A1 | 3/2018 | Ma |
| 2020/0035164 A1* | 1/2020 | Qing .................... G09G 3/3275 |
| 2020/0074928 A1 | 3/2020 | Li et al. |
| 2020/0184893 A1 | 6/2020 | Dong |

FOREIGN PATENT DOCUMENTS

| | | |
|---|---|---|
| CN | 105427800 A | 3/2016 |
| CN | 207425322 U | 5/2018 |
| CN | 108206008 A | 6/2018 |
| CN | 108288455 A | 7/2018 |
| CN | 108470539 A | 8/2018 |
| CN | 108877680 A | 11/2018 |
| CN | 109256094 A | 1/2019 |
| KR | 100833753 B1 | 5/2008 |
| KR | 20080109137 A | 12/2008 |

OTHER PUBLICATIONS

International Search Report of PCT/CN2019/111022 and English translation, dated Dec. 30, 2019, 18 pages.

* cited by examiner

PIXEL CIRCUIT, PIXEL DRIVING METHOD AND DISPLAY DEVICE

CROSS-REFERENCE TO RELATED APPLICATIONS

This application is the U.S. national phase of PCT Application No. PCT/CN2019/111022 filed on Oct. 14, 2019, which claims a priority to Chinese Patent Application No. 201811479299.8 filed in China on Dec. 5, 2018, the disclosures of which are incorporated herein in their entirety by reference.

TECHNICAL FIELD

The present disclosure relates to the field of display technology, in particular to a pixel circuit, a pixel driving method and a display device.

BACKGROUND

Image sticking has always been a difficult problem in an OLED display device. A cause of the image sticking is a hysteresis effect of a driving transistor. When an image is displayed in a monitor for a long time and then switched to a next image, the image is remained in the next image. The phenomenon is referred to as the image sticking.

SUMMARY

A pixel circuit is provided in the present disclosure, including a light-emitting element, a driving unit, a light-emitting control unit, a driving control unit, an energy storage unit, a first reset unit and a second reset unit, where the first reset unit is respectively connected to a reset control line, a first terminal of the driving unit and a first voltage line, and configured to write a first voltage output by the first voltage line into the first terminal of the driving unit under control of the reset control line; the second reset unit is respectively connected to the reset control line, a control terminal of the driving unit and an initial voltage line, and configured to write an initial voltage output by the initial voltage line into the control terminal of the driving unit under control of the reset control line; the light-emitting control unit is respectively connected to a light-emitting control line, the first terminal of the driving unit, a second terminal of the driving unit, the first voltage line and a first electrode of the light-emitting element, and configured to conduct or disconnect a connection between the first terminal of the driving unit and the first voltage line, and conduct or disconnect a connection between the second terminal of the driving unit and the first electrode of the light-emitting element under control of the light-emitting control line; a second electrode of the light-emitting element is connected to a second voltage line; the driving control unit is respectively connected to a gate line, a data line, the control terminal of the driving unit, the first terminal of the driving unit and the second terminal of the driving unit, and configured to write a data voltage on the data line into the first terminal of the driving unit, and conduct or disconnect a connection between the control terminal of the driving unit and the second terminal of the driving unit under control of the gate line; a first terminal of the energy storage unit is connected to the control terminal of the driving unit, and a second terminal of the energy storage unit is connected to the first voltage line, the energy storage unit is configured to maintain a potential of the control terminal of the driving unit; and the driving unit is configured to drive the light-emitting element to emit light under control of the control terminal of the driving unit.

In an implementation, the first reset unit includes a first reset transistor; a gate electrode of the first reset transistor is connected to the reset control line, a first electrode of the first reset transistor is connected to the first voltage line, and a second electrode of the first reset transistor is connected to the first terminal of the driving unit.

In an implementation, the second reset unit includes a second reset transistor; a gate electrode of the second reset transistor is connected to the reset control line, a first electrode of the second reset transistor is connected to the control terminal of the driving unit, and a second electrode of the second reset transistor is connected to the initial voltage line.

In an implementation, the driving unit includes a driving transistor; a gate electrode of the driving transistor is the control terminal of the driving unit, a first electrode of the driving transistor is the first terminal of the driving unit, and a second electrode of the driving transistor is the second terminal of the driving unit.

In an implementation, the light-emitting control unit includes a first light-emitting control transistor and a second light-emitting control transistor, a gate electrode of the first light-emitting control transistor is connected to the light-emitting control line, a first electrode of the first light-emitting control transistor is connected to the first voltage line, and a second electrode of the first light-emitting control transistor is connected to the first terminal of the driving unit; and a gate electrode of the second light-emitting control transistor is connected to the light-emitting control line, a first electrode of the second light-emitting control transistor is connected to the second terminal of the driving unit, and a second electrode of the second light-emitting control transistor is connected to the first electrode of the light-emitting element.

In an implementation, the energy storage unit includes a storage capacitor, a first terminal of the storage capacitor is connected to the control terminal of the driving unit, and a second terminal of the storage capacitor is connected to the first voltage line.

In an implementation, the light-emitting element includes an organic light-emitting diode, an anode of the organic light-emitting diode is the first electrode of the light-emitting element, and a cathode of the organic light-emitting diode is the second electrode of the light-emitting element.

In an implementation, the driving control unit includes a first driving control transistor and a second driving control transistor, a gate electrode of the first driving control transistor is connected to the gate line, a first electrode of the first driving control transistor is connected to the first terminal of the driving unit, and a second electrode of the first driving control transistor is connected to the data line; and a gate electrode of the second driving control transistor is connected to the gate line, a first electrode of the second driving control transistor is connected to the control terminal of the driving unit, and a second electrode of the second driving control transistor is connected to the second terminal of the driving unit.

In an implementation, the second reset unit is further configured to write the initial voltage output by the initial voltage line into the first electrode of the light-emitting element under control of the reset control line.

In an implementation, the second reset unit further includes a third reset transistor; a gate electrode of the third reset transistor is connected to the reset control line, a first electrode of the third reset transistor is connected to the first electrode of the light-emitting element, and a second electrode of the third reset transistor is connected to the initial voltage line.

A pixel driving method is further provided in the present disclosure, applied to the pixel circuit described above, the pixel driving method including: during a reset stage, writing, by the first reset unit, the first voltage output by the first voltage line into the first terminal of the driving unit under control of the reset control line to reset a potential of the first terminal of the driving unit, and writing, by the second reset unit, the initial voltage output by the initial voltage line into the control terminal of the driving unit under control of the reset control line to reset the potential of the control terminal of the driving unit.

In an implementation, a display period includes the reset stage, a driving control stage and a light-emitting stage which are sequentially set; the driving unit includes a driving transistor, a gate electrode of the driving transistor is the control terminal of the driving unit, a first electrode of the driving transistor is the first terminal of the driving unit, and a second electrode of the driving transistor is the second terminal of the driving unit; the pixel driving method further includes: during the driving control stage, writing, by the driving control unit, a data voltage Vdata on the data line into the first electrode of the driving transistor under control of the gate line, connecting, by the driving control unit, the gate electrode of the driving transistor and the second electrode of the driving transistor to turn on the driving transistor, charging the energy storage unit via the first voltage output by the first voltage line to raise the potential of the gate electrode of the driving transistor until the potential of the gate electrode of the driving transistor is Vdata+Vth, and turning off the driving transistor, Vth is a threshold voltage of the driving transistor; during the light-emitting stage, conducting, by the light-emitting control unit, the connection between the first voltage line and the first electrode of the driving transistor under control of the light-emitting control line, and conducting the connection between the second electrode of the driving transistor and the first electrode of the light-emitting element; and turning on the driving transistor to drive the light-emitting element to emit light.

In an implementation, the pixel driving method further includes: during the reset stage, writing the initial voltage output by the initial voltage line into the first electrode of the light-emitting element under control of the reset control line to reset a potential of the first electrode of the light-emitting element.

A pixel circuit is further provided in the present disclosure, including a light-emitting element, a storage capacitor, a driving transistor, a first reset transistor, a second reset transistor, a first light-emitting control transistor, a second light-emitting control transistor, a first driving control transistor, and a second driving control transistor; where, a gate electrode of the first reset transistor is connected to a reset control line, a first electrode of the first reset transistor is connected to a first voltage line, and a second electrode of the first reset transistor is connected to a first electrode of the driving transistor; a gate electrode of the second reset transistor is connected to the reset control line, a first electrode of the second reset transistor is connected to a gate electrode of the driving transistor, and a second electrode of the second reset transistor is connected to an initial voltage line; a gate electrode of the first light-emitting control transistor is connected to a light-emitting control line, a first electrode of the first light-emitting control transistor is connected to the first voltage line, and a second electrode of the first light-emitting control transistor is connected to the first electrode of the driving transistor; a gate electrode of the second light-emitting control transistor is connected to the light-emitting control line, a first electrode of the second light-emitting control transistor is connected to a second electrode of the driving transistor, and a second electrode of the second light-emitting control transistor is connected to a first electrode of the light-emitting element; a second electrode of the light-emitting element is connected to a second voltage line; a first terminal of the storage capacitor is connected to the gate electrode of the driving transistor, and a second terminal of the storage capacitor is connected to the first voltage line; a gate electrode of the first driving control transistor is connected to a gate line, a first electrode of the first driving control transistor is connected to the first electrode of the driving transistor, and a second electrode of the first driving control transistor is connected to a data line; and a gate electrode of the second driving control transistor is connected to the gate line, a first electrode of the second driving control transistor is connected to the gate electrode of the driving transistor, and a second electrode of the second driving control transistor is connected to the second electrode of the driving transistor.

In an implementation, the pixel circuit further includes a third reset transistor; a gate electrode of the third reset transistor is connected to the reset control line, a first electrode of the third reset transistor is connected to the first electrode of the light-emitting element, and a second electrode of the third reset transistor is connected to the initial voltage line.

A display device is further provided in the present disclosure, including the pixel circuit described above.

In an implementation, the display device further includes a display substrate, the first reset unit in the pixel circuit includes a first reset transistor, and the driving unit in the pixel circuit includes a driving transistor; the display device includes a gate metal layer, an active layer and a source-drain metal layer which are disposed on the display substrate, and an insulation layer disposed between the active layer and the source-drain metal layer; a pattern of the gate metal layer includes a reset control line and a gate electrode of the first reset transistor; the gate electrode of the first reset transistor is connected to the reset control line; a pattern of the source-drain metal layer includes the first voltage line, a source electrode of the first reset transistor, a drain electrode of the first reset transistor and a source electrode of the driving transistor; the source electrode of the first reset transistor is connected to the first voltage line, and the drain electrode of the first reset transistor is connected to the source electrode of the driving transistor; and the source electrode of the first reset transistor is connected to the active layer through a first via hole penetrating the insulation layer, and the drain electrode of the first reset transistor is connected to the active layer through a second via hole penetrating the insulation layer.

In an implementation, the second reset unit in the pixel circuit includes a second reset transistor, a gate electrode of the driving transistor is connected to a drain electrode of the second reset transistor through a third via hole; and the source electrode of the driving transistor is connected to the active layer through a fourth via hole penetrating the insulation layer.

In an implementation, the second reset unit in the pixel circuit includes a second reset transistor, a source electrode of the second reset transistor is connected to the active layer through a fifth via hole penetrating the insulation layer, and a drain electrode of the second reset transistor is connected to the active layer through a sixth via hole penetrating the insulation layer.

In an implementation, the light-emitting control unit in the pixel circuit includes a first light-emitting control transistor and a second light-emitting control transistor, a source electrode of the first light-emitting control transistor is connected to the active layer through a seventh via hole penetrating the insulation layer, a drain electrode of the second light-emitting control transistor is connected to the active layer through an eighth via hole penetrating the insulation layer.

In an implementation, the driving control unit in the pixel circuit includes a first driving control transistor, a drain electrode of the first driving control transistor is connected to the active layer through a ninth via hole penetrating the insulation layer.

In an implementation, the second reset unit in the pixel circuit further includes a third reset transistor, a source electrode of the third reset transistor is connected to the active layer through a tenth via hole penetrating the insulation layer.

In an implementation, the second reset unit in the pixel circuit includes a second reset transistor and a third reset transistor, the gate electrode of the first reset transistor, a gate electrode of the second reset transistor and a gate electrode of the third reset transistor are disposed successively along a direction from the data line to the first voltage line at an intersection of the reset control line and the active layer.

In an implementation, the driving control unit in the pixel circuit includes a first driving control transistor and a second driving control transistor, a gate electrode of the first driving control transistor and a gate electrode of the second driving control transistor are disposed successively along a direction from the data line to the first voltage line at an intersection of the gate line and the active layer.

In an implementation, the light-emitting control unit in the pixel circuit includes a first light-emitting control transistor and a second light-emitting control transistor, a gate electrode of the first light-emitting control transistor and a gate electrode of the second light-emitting control transistor are disposed successively along a direction from the data line to the first voltage line at an intersection of the light-emitting control line and the active layer.

DETAILED DESCRIPTION

Technical solutions of some embodiments of the present disclosure will be illustrated clearly and completely hereinafter with reference to the accompanying drawings of some embodiments of the present disclosure. Obviously, the embodiments described merely relate to a part of, rather than all of, the embodiments of the present disclosure, and based on these embodiments, a person skilled in the art may, without any creative effort, obtain the other embodiments, which also fall within the scope of the present disclosure.

Transistors in all embodiments of the present disclosure may be thin film transistors, field effect transistors or other devices with same characteristics. In some embodiments of the present disclosure, in order to distinguish two electrodes of a transistor besides a gate electrode, one of the two electrodes is referred to as a first electrode, and the other is referred to as a second electrode. In a practical operation, the first electrode may be a drain electrode, the second electrode may be a source electrode; or, the first electrode may be the source electrode, and the second electrode may be the drain electrode.

In view of an image sticking problem, solutions relating to a process are adopted in the related art, but an improvement effect is slight. This is because only a potential of a gate electrode of a driving transistor is reset during a reset stage in the related art, and a potential of a source electrode of the driving transistor still maintains a grayscale voltage of a previous frame, and an image sticking phenomenon occurs, which is described in detail as follows.

After a black-and-white checkerboard image is displayed on an OLED display panel for a while, a grayscale of each display image of the OLED display panel is switched to a grayscale 48. However, initial states of the driving transistors in the related art are different, for example, an initial potential of a source electrode of a driving transistor in a pixel circuit displaying a white image is V_L255, and an initial potential of the source electrode of the driving transistor in the pixel circuit displaying a black image is V_L0, where V_L255 is a data voltage corresponding to a grayscale 255, and V_L0 is a data voltage corresponding to a grayscale 0. Due to a response speed of the driving transistor, the time to reach same brightness (such as brightness corresponding to the grayscale 48) is prolonged. That is, corresponding currents are different when writing the same data voltage, resulting in different display brightness and the image sticking.

Figure 1:
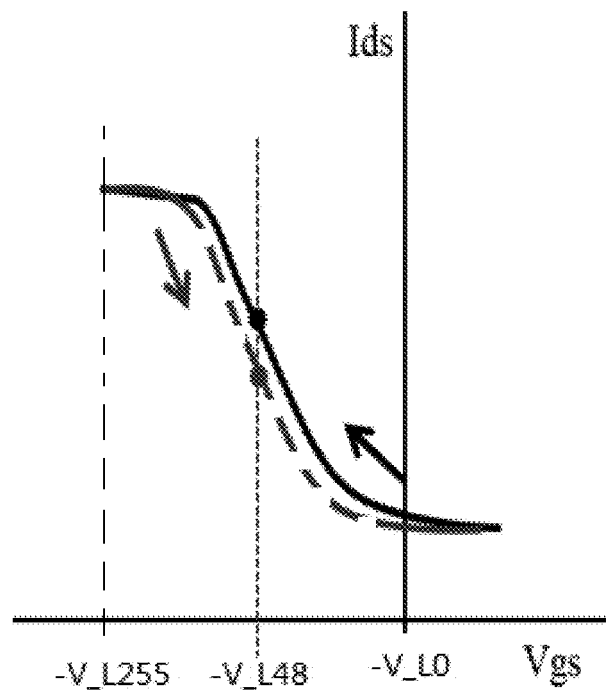
FIG. 1 is a schematic diagram illustrating change curves of a drain-source current of a driving transistor when a pixel circuit in the related art switches from a low grayscale display to a predetermined grayscale display, and from a high grayscale display to the predetermined grayscale display.

As shown in FIG. 1, a horizontal axis is a gate-source voltage Vgs of the driving transistor, a vertical axis is a drain-source current Ids of the driving transistor. A curve drawn with a solid line is a curve switching from a white image display state (a corresponding gate-source voltage is V_L0) to a state of displaying an image of grayscale 48 when the initial state is the white image display state. A curve drawn with a dashed line is a curve switching from a black image display state (a corresponding gate-source voltage is V_L255) to the state of displaying an image of grayscale 48 when the initial state is the black image display state. It can be seen from FIG. 1 that values of corresponding Ids are different when corresponding data voltages are written, that is, corresponding display brightness are different, thereby forming the image sticking. In FIG. 1, V_L48 is a data voltage corresponding to the grayscale 48.

Figure 2:
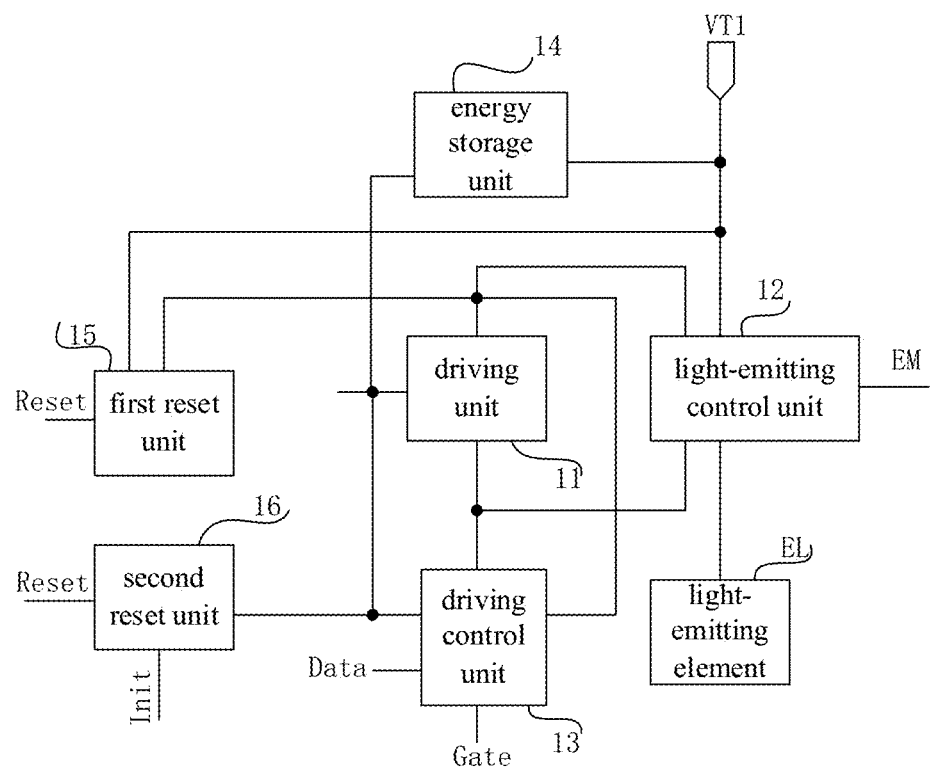
FIG. 2 is a structural diagram of a pixel circuit in some embodiments of the present disclosure.

As shown in FIG. 2, a pixel circuit in some embodiments of the present disclosure includes a light-emitting element EL, a driving unit 11, a light-emitting control unit 12, a driving control unit 13, an energy storage unit 14, a first reset unit 15 and a second reset unit 16.

The first reset unit 15 is respectively connected to a reset control line Reset, a first terminal of the driving unit 11 and a first voltage line VT1, and configured to write a first voltage V1 output by the first voltage line VT1 into the first terminal of the driving unit 11 under control of the reset control line Reset.

The second reset unit 16 is respectively connected to the reset control line Reset, a control terminal of the driving unit 11 and an initial voltage line Init, and configured to write an initial voltage Vinit output by the initial voltage line Init into the control terminal of the driving unit 11 under control of the reset control line Reset.

The light-emitting control unit 12 is respectively connected to a light-emitting control line EM, the first terminal of the driving unit 11, a second terminal of the driving unit 11, the first voltage line VT1 and the light-emitting element EL, and configured to conduct or disconnect a connection between the first terminal of the driving unit 11 and the first voltage line VT1, and conduct or disconnect a connection between the second terminal of the driving unit 11 and a first electrode of the light-emitting element EL under control of the light-emitting control line EM; a second electrode of the light-emitting element EL is connected to a second voltage line VT2.

The driving control unit 13 is respectively connected to a gate line Gate, a data line Data, the control terminal of the driving unit 11, the first terminal of the driving unit 11 and the second terminal of the driving unit 11, and configured to write a data voltage Vdata on the data line Data into the first terminal of the driving unit 11, and conduct or disconnect a connection between the control terminal of the driving unit 11 and the second terminal of the driving unit 11 under control of the gate line Gate.

A first terminal of the energy storage unit 14 is connected to the control terminal of the driving unit 11, and a second terminal of the energy storage unit 14 is connected to the first voltage line VT1. The energy storage unit 14 is configured to maintain a potential of the control terminal of the driving unit 11.

The driving unit 11 is configured to drive the light-emitting element EL to emit light under control of the control terminal of the driving unit 11.

The first reset unit 15 is added in the pixel circuit in some embodiments of the present disclosure. The first reset unit 15 resets the potential of the first terminal of the driving unit 11 during a reset stage, and together with the second reset unit 16, reset the potential of the control terminal of the driving unit 11 and the potential of the first terminal of the driving unit 11 simultaneously, so that an initial state of the driving unit 11 before the data voltage is written is fixed. During a driving control stage (i.e., a data voltage writing stage), the driving unit 11 is in a stable state, which may greatly reduce a hysteresis effect and achieve a purpose of eliminating the image sticking.

When an embodiment of the pixel circuit shown in FIG. 2 of the present disclosure is in operation, during the reset stage, the first reset unit 15 writes the first voltage V1 output by the first voltage line VT1 into the first terminal of the driving unit 11 under control of the reset control line Reset, to reset the potential of the first terminal of the driving unit 11, and the second reset unit 16 writes the initial voltage Vinit output by the initial voltage line Init into the control terminal of the driving unit 11 under control of the reset control line Reset, to reset the potential of the control terminal of the driving unit 11.

Specifically, the driving unit may include a driving transistor; a gate electrode of the driving transistor is the control terminal of the driving unit, a first electrode of the driving transistor is the first terminal of the driving unit, and a second electrode of the driving transistor is the second terminal of the driving unit.

Figure 3:
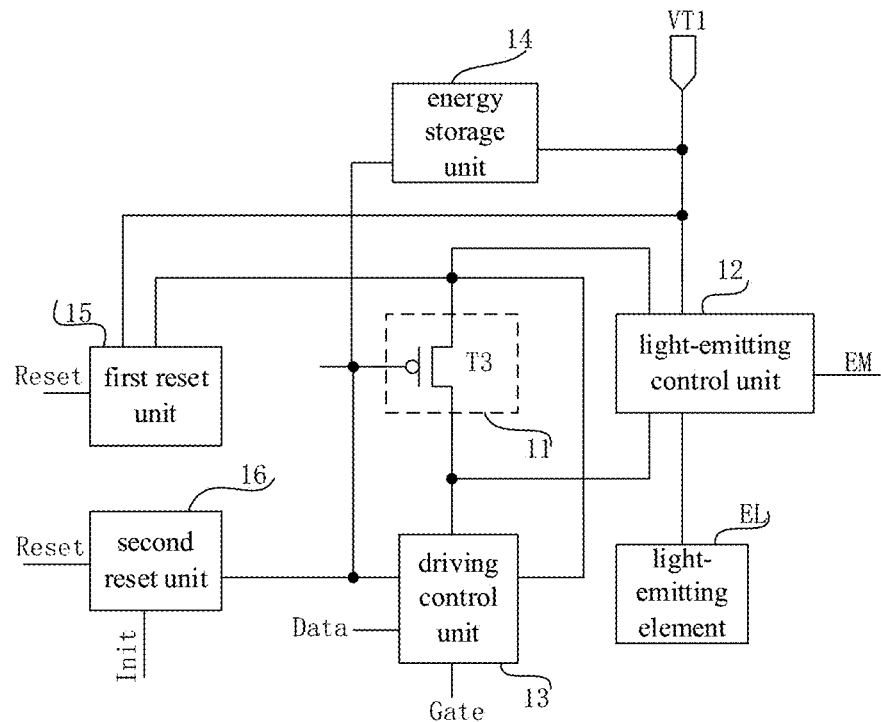
FIG. 3 is another structural diagram of a pixel circuit in some embodiments of the present disclosure.

In a specific implementation, as shown in FIG. 3, based on the embodiment of the pixel circuit shown in FIG. 2, the driving unit 11 includes a driving transistor T3; a gate electrode of the driving transistor T3 is the control terminal of the driving unit 11, a source electrode of the driving transistor T3 is the first terminal of the driving unit 11, and a drain electrode of the driving transistor T3 is the second terminal of the driving unit 11.

The first voltage line is a high voltage line that outputs a high voltage Vdd, and the first voltage is the high voltage Vdd.

In the embodiment shown in FIG. 3, T3 is a p-type transistor, but the disclosure is not limited thereto.

Figure 4:
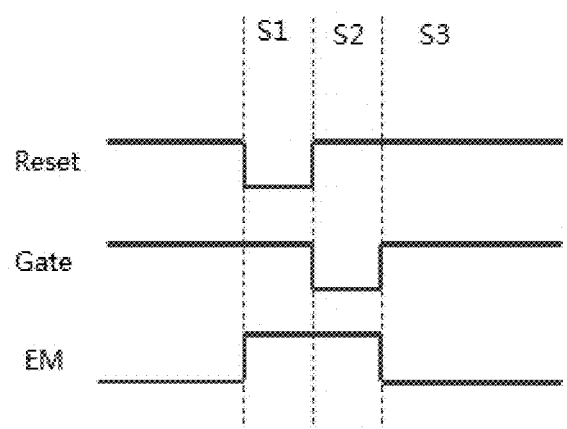
FIG. 4 is an operation timing diagram of a pixel circuit in some embodiments of the present disclosure.

As shown in FIG. 4, the pixel circuit shown in FIG. 3 of the present disclosure is in operation, a display period includes a reset stage S1, a driving control stage S2, and a light-emitting stage S3 which are sequentially set.

During the reset stage S1, the first reset unit 15 writes the high voltage Vdd output by the high voltage line into the source electrode of the T3 under control of the reset control line Reset, to reset a potential of the source electrode of the T3, and the second reset unit 16 writes the initial voltage Vinit output by the initial voltage line Init into the gate electrode of the T3 under control of the reset control line Reset, to reset a potential of the gate electrode of the driving transistor T3.

During the driving control stage S2, the driving control unit 13 writes the data voltage Vdata on the data line Data into the source electrode of the T3 under control of the gate line Gate, the driving control unit 13 connects the gate electrode of the T3 and the drain electrode of the T3, the T3 is turned on, the energy storage unit 14 is charged via the high voltage Vdd output by the high voltage line to raise the potential of the gate electrode of the T3 until the potential of the gate electrode of the T3 is Vdata+Vth, the T3 is turned off, Vth is a threshold voltage of the T3.

During the light-emitting stage S3, the light-emitting control unit 12 conducts the connection between the high voltage line and the source electrode of the T3, and conducts the connection between the drain electrode of the T3 and the first electrode of the light-emitting element EL under control of the light-emitting line EM, the driving transistor T3 is turned on to drive the light-emitting element EL to emit light.

The first reset unit 15 is added in the pixel circuit shown in FIG. 3 of the present disclosure. The potential of the source electrode of the T3 is reset to Vdd by providing the first reset unit 15, and the potential of the gate electrode of the T3 is reset to Vinit by providing the second reset unit 16 during the reset stage S1, so that a gate-source voltage Vgs of the T3 is fixed before the data voltage is written, and an initial state of the T3 is fixed. During the driving control stage (i.e., the data voltage writing stage), the driving transistor T3 is in a stable state, which may greatly reduce a hysteresis effect and achieve a purpose of eliminating the image sticking.

In some embodiments of the present disclosure, the potential of the source electrode of the driving transistor included in the driving unit 11 is reset to Vdd by providing the first reset unit 15 during the reset stage, so that change curves in a drain-source current of the driving transistor during the light-emitting stage are almost the same (no matter switching from a low grayscale display to a predetermined grayscale display, or from a high grayscale display to the predetermined grayscale display), it is ensured that the current changes are the same, and there is no difference in the image display, that is, there is no obvious image sticking.

Figure 5:
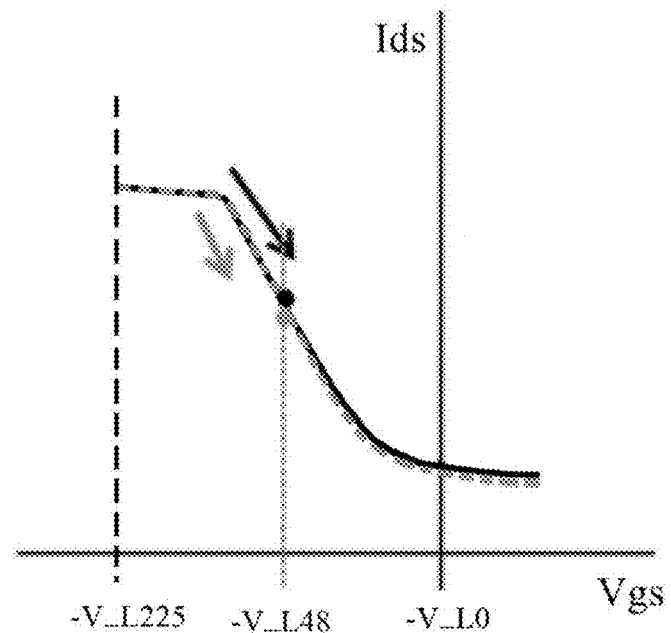
FIG. 5 is a schematic diagram illustrating change curves of a drain-source current of a driving transistor when a pixel circuit in some embodiments of the present disclosure switches from a low grayscale display to a predetermined grayscale display, and from a high grayscale display to the predetermined grayscale display.

As shown in FIG. 5, a horizontal axis is the gate-source voltage Vgs of the driving transistor, a vertical axis is a drain-source current Ids of the driving transistor. A curve drawn with a solid line is a curve switching from a white image display state to a state of displaying an image of grayscale 48 when the initial state is the white image display state (the corresponding gate-source voltage is V_L0). A curve drawn with a dashed line is a curve switching from a black image display state to the state of displaying an image of grayscale 48 when the initial state is the black image display state (the corresponding gate-source voltage is V_L255). It can be seen from FIG. 5, when corresponding data voltages are written, no matter switching from a low grayscale display to a predetermined grayscale display, or from a high grayscale display to the predetermined grayscale display, change curves in the drain-source current of the driving transistor during the light-emitting stage are almost the same, values of corresponding Ids are almost the same that is, corresponding display brightness are almost the same, and there is no image sticking. In FIG. 5, V_L48 is a data voltage corresponding to the grayscale 48.

Specifically, the first reset unit may include a first reset transistor; a gate electrode of the first reset transistor is connected to the reset control line, a first electrode of the first reset transistor is connected to the first voltage line, and a second electrode of the first reset transistor is connected to the first terminal of the driving unit.

Specifically, the second reset unit may include a second reset transistor; a gate electrode of the second reset transistor is connected to the reset control line, a first electrode of the second reset transistor is connected to the control terminal of the driving unit, and a second electrode of the second reset transistor is connected to the initial voltage line.

Specifically, the light-emitting control unit may include a first light-emitting control transistor and a second light-emitting control transistor, a gate electrode of the first light-emitting control transistor is connected to the light-emitting control line, a first electrode of the first light-emitting control transistor is connected to the first voltage line, and a second electrode of the first light-emitting control transistor is connected to the first terminal of the driving unit; a gate electrode of the second light-emitting control transistor is connected to the light-emitting control line, a first electrode of the second light-emitting control transistor is connected to the second terminal of the driving unit, and a second electrode of the second light-emitting control transistor is connected to the first electrode of the light-emitting element.

In a specific implementation, the energy storage unit includes a storage capacitor, a first terminal of the storage capacitor is connected to the control terminal of the driving unit, and a second terminal of the storage capacitor is connected to the first voltage line.

In a specific implementation, the light-emitting element includes an organic light-emitting diode, an anode of the organic light-emitting diode is the first electrode of the light-emitting element, and a cathode of the organic light-emitting diode is the second electrode of the light-emitting element Specifically, the driving control unit may include a first driving control transistor and a second driving control transistor, a gate electrode of the first driving control transistor is connected to the gate line, a first electrode of the first driving control transistor is connected to the first terminal of the driving unit, and a second electrode of the first driving control transistor is connected to the data line; a gate electrode of the second driving control transistor is connected to the gate line, a first electrode of the second driving control transistor is connected to the control terminal of the driving unit, and a second electrode of the second driving control transistor is connected to the second terminal of the driving unit.

In a specific implementation, the second reset unit may be further connected to the initial voltage line and the first electrode of the light-emitting element respectively, and configured to write the initial voltage output by the initial voltage line into the first electrode of the light-emitting element under control of the reset control line, so that the potential of the first electrode of the light-emitting element is reset to the initial voltage during the reset stage, thereby avoiding an influence of residual charges of the first electrode of the light-emitting element on the display.

Specifically, the second reset unit may further include a third reset transistor; a gate electrode of the third reset transistor is connected to the reset control line, a first electrode of the third reset transistor is connected to the first electrode of the light-emitting element, and a second electrode of the third reset transistor is connected to the initial voltage line A pixel circuit in some embodiments of the present disclosure includes a light-emitting element, a storage capacitor, a driving transistor, a first reset transistor, a second reset transistor, a first light-emitting control transistor, a second light-emitting control transistor, a first driving control transistor and a second driving control transistor; a gate electrode of the first reset transistor is connected to a reset control line, a first electrode of the first reset transistor is connected to a first voltage line, and a second electrode of the first reset transistor is connected to a first electrode of the driving transistor; a gate electrode of the second reset transistor is connected to the reset control line, a first electrode of the second reset transistor is connected to a gate electrode of the driving transistor, and a second electrode of the second reset transistor is connected to an initial voltage line; a gate electrode of the first light-emitting control transistor is connected to a light-emitting control line, a first electrode of the first light-emitting control transistor is connected to the first voltage line, and a second electrode of the first light-emitting control transistor is connected to the first electrode of the driving transistor; a gate electrode of the second light-emitting control transistor is connected to the light-emitting control line, a first electrode of the second light-emitting control transistor is connected to a second electrode of the driving transistor, and a second electrode of the second light-emitting control transistor is connected to a first electrode of the light-emitting element; a second electrode of the light-emitting element is connected to a second voltage line; a first terminal of the storage capacitor is connected to the gate electrode of the driving transistor, and a second terminal of the storage capacitor is connected to the first voltage line; a gate electrode of the first driving control transistor is connected to a gate line, a first electrode of the first driving control transistor is connected to the first electrode of the driving transistor, and a second electrode of the first driving control transistor is connected to a data line; a gate electrode of the second driving control transistor is connected to the gate line, a first electrode of the second driving control transistor is connected to the gate electrode of the driving transistor, and a second electrode of the second driving control transistor is connected to the second electrode of the driving transistor.

The first reset transistor is added in the pixel circuit in some embodiments of the present disclosure. The first reset transistor resets the potential of the first electrode of the driving transistor during a reset stage, and together with the second reset transistor, reset the potential of the gate electrode of the driving transistor and the potential of the first electrode of the driving transistor simultaneously, so that an initial state of the driving transistor is fixed before the data voltage is written. During a driving control stage (i.e., a data voltage writing stage), the driving transistor is in a stable state, which may greatly reduce a hysteresis effect and achieve a purpose of eliminating the image sticking.

In a specific implementation, the pixel circuit in some embodiments of the present disclosure may further include a third reset transistor; a gate electrode of the third reset transistor is connected to the reset control line, a first electrode of the third reset transistor is connected to the first electrode of the light-emitting element, and a second electrode of the third reset transistor is connected to the initial voltage line Init. The potential of the first electrode of the light-emitting element is reset during the reset stage by further providing the third reset transistor in the pixel circuit according to some embodiments of the present disclosure.

The pixel circuit in the present disclosure is described hereinafter through a specific embodiment.

Figure 6:
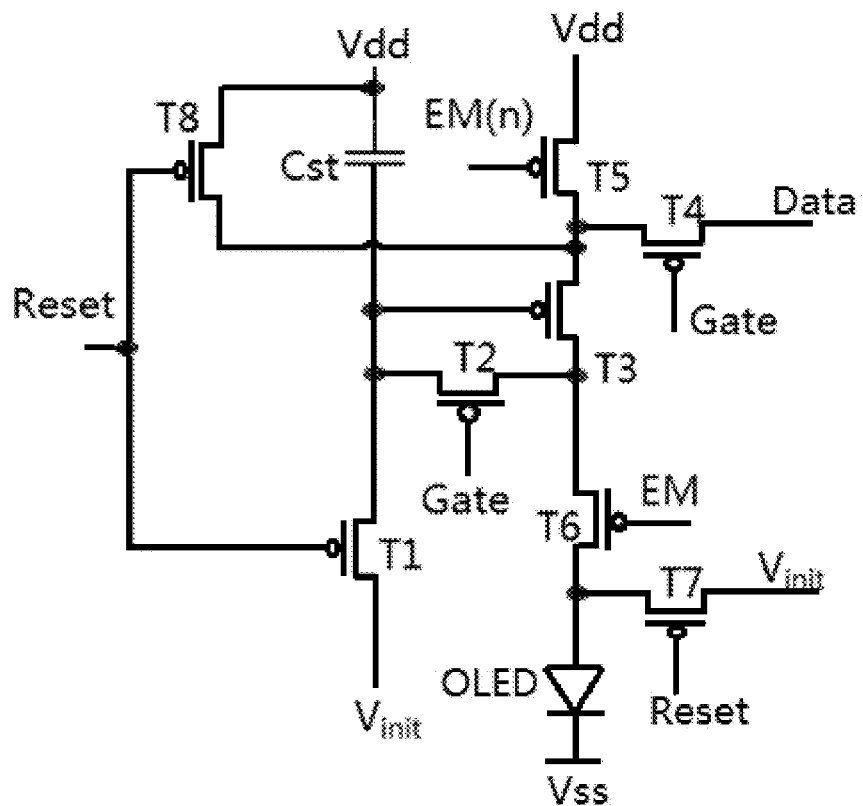
FIG. 6 is a circuit diagram of a pixel circuit in some embodiments of the present disclosure.

As shown in FIG. 6, the specific embodiment of the pixel circuit in the present disclosure includes an organic light-emitting diode OLED, a driving unit, a light-emitting control unit, a driving control unit, an energy storage unit, a first reset unit and a second reset unit.

The driving unit includes a driving transistor T3; the first reset unit includes a first reset transistor T8; the second reset unit includes a second reset transistor T1 and a third reset transistor T7; the light-emitting control unit includes a first light-emitting control transistor T5 and a second light-emitting control transistor T6; the energy storage unit includes a storage capacitor Cst; and the driving control unit includes a first driving control transistor T4 and a second driving control transistor T2.

A gate electrode of the first reset transistor T8 is connected to a reset control line Reset, a source electrode of the first reset transistor T8 is connected to a high voltage line, and a drain electrode of the first reset transistor T8 is connected to a source electrode of the driving transistor T3; the high voltage line is configured to output a high voltage Vdd.

A gate electrode of the second reset transistor T1 is connected to the reset control line Reset, a source electrode of the second reset transistor T1 is connected to a gate electrode of the driving transistor T3, and a drain electrode of the second reset transistor T1 is connected to an initial voltage line; the initial voltage line is configured to output an initial voltage Vinit.

A gate electrode of the third reset transistor T7 is connected to the reset control line Reset, a source electrode of the third reset transistor T7 is connected to an anode of the organic light-emitting diode OLED, and a drain electrode of the third reset transistor T7 is connected to the initial voltage line.

A gate electrode of the first light-emitting control transistor T5 is connected to a light-emitting control line EM, a source electrode of the first light-emitting control transistor T5 is connected to the high voltage line, and a drain electrode of the first light-emitting control transistor T5 is connected to the source electrode of the driving transistor T3.

A gate electrode of the second light-emitting control transistor T6 is connected to the light-emitting control line EM, a source electrode of the second light-emitting control transistor T6 is connected to a drain electrode of the driving transistor T3, and a drain electrode of the second light-emitting control transistor T6 is connected to the anode of the OLED.

A first terminal of the storage capacitor Cst is connected to the gate electrode of the driving transistor T3, and a second terminal of the storage capacitor Cst is connected to the high voltage line.

A gate electrode of the first driving control transistor T4 is connected to a gate line Gate, a source electrode of the first driving control transistor T4 is connected to the source electrode of the driving transistor T3, and a drain electrode of the first driving control transistor T4 is connected to a data line Data.

A gate electrode of the second driving control transistor T2 is connected to the gate line Gate, a source electrode of the second driving control transistor T2 is connected to the gate electrode of the driving transistor T3, and a drain electrode of the second driving control transistor T2 is connected to the drain electrode of the driving transistor T3.

A cathode of the OLED is connected to a low voltage line which is used to output a low voltage Vss.

In the embodiment shown in FIG. 6, each transistor is a p-type transistor, but the disclosure is not limited thereto.

As shown in FIG. 4, the pixel circuit shown in FIG. 6 of the present disclosure is in operation, a display period includes a reset stage S1, a driving control stage S2 and a light-emitting stage S3 which are sequentially set.

During the reset stage S1, a low voltage is output by the Reset, a high voltage is output by both the EM and the Gate, the T8 is turned on to write the high voltage Vdd output by the high voltage line into the source electrode of the T3, so as to reset a potential of the source electrode of the T3. The T1 is turned on to write the initial voltage Vinit output by the initial voltage line into the gate electrode of the T3, so as to reset a potential of the gate electrode of the T3. And T7 is turned on to write the Vinit into the anode of the OLED, so as to reset a potential of the anode of the OLED.

During the driving control stage S2, a low voltage is output by the Gate, a high voltage is output by both the EM and the Reset, both the T2 and the T4 are turned on to write the data voltage Vdata on the data line Data into the source electrode of the T3, the gate electrode of the T3 and the drain electrode of the T3 are connected to turn on the T3. The Cst is charged via the high voltage Vdd output by the high voltage line to raise the potential of the gate electrode of the T3 until the potential of the gate electrode of the T3 is Vdata+Vth, and the T3 is turned off, Vth is a threshold voltage of the T3.

During the light-emitting stage S3, a low voltage is output by the EM, a high voltage is output by both the Gate and the Reset, both the T5 and the T6 are turned on to conduct a connection between the high voltage line and the source electrode of the T3, and conduct a connection between the drain electrode of the T3 and the anode of the OLED, the T3 is turned on to drive the OLED to emit light.

The T8 is added in the pixel circuit shown in FIG. 6 of the present disclosure. The potential of the source electrode of the T3 is reset to Vdd by providing the T8, and the potential of the gate electrode of the T3 is reset to Vinit by providing the T1 during the reset stage S1, so that a gate-source voltage Vgs of the T3 is fixed before the data voltage is written, and an initial state of the T3 is fixed. During the driving control stage (i.e., the data voltage writing stage), the driving transistor T3 is in a stable state, which may greatly reduce a hysteresis effect and achieve a purpose of eliminating the image sticking.

A pixel driving method in some embodiments of the present disclosure is applied to the pixel circuit described above, the pixel driving method includes: during a reset stage, writing, by the first reset unit, the first voltage output by the first voltage line into the first terminal of the driving unit under control of the reset control line, to reset a potential of the first terminal of the driving unit, and writing, by the second reset unit, the initial voltage output by the initial voltage line into the control terminal of the driving unit under control of the reset control line, to reset the potential of the control terminal of the driving unit.

The first reset unit is added in the pixel driving method in some embodiments of the present disclosure. The first reset unit resets the potential of the first terminal of the driving unit during a reset stage, and together with the second reset unit, reset the potential of the control terminal of the driving unit and the potential of the first terminal of the driving unit simultaneously, so that an initial state of the driving unit is fixed before the data voltage is written. During a driving control stage (i.e., a data voltage writing stage), the driving unit is in a stable state, which may greatly reduce a hysteresis effect and achieve a purpose of eliminating the image sticking.

In a specific implementation, a display period includes the reset stage, a driving control stage and a light-emitting stage which are sequentially set; the driving unit includes a driving transistor, a gate electrode of the driving transistor is the control terminal of the driving unit, a first electrode of the driving transistor is the first terminal of the driving unit, and a second electrode of the driving transistor is the second terminal of the driving unit; the pixel driving method further includes: during the driving control stage, writing, by the driving control unit, a data voltage Vdata on the data line into the first electrode of the driving transistor under control of the gate line, connecting, by the driving control unit, the gate electrode of the driving transistor and the second electrode of the driving transistor to turn on the driving transistor, charging the energy storage unit via the first voltage output by the first voltage line to raise the potential of the gate electrode of the driving transistor until the potential of the gate electrode of the driving transistor is Vdata+Vth, turning off the driving transistor, Vth is a threshold voltage of the driving transistor; during the light-emitting stage, conducting, by the light-emitting control unit, the connection between the first voltage line and the first electrode of the driving transistor under control of the light-emitting control line, and conducting the connection between the second electrode of the driving transistor and the first electrode of the light-emitting element; and turning on the driving transistor to drive the light-emitting element to emit light.

In a specific implementation, the pixel driving method further includes: during the reset stage, writing the initial voltage output by the initial voltage line into the first electrode of the light-emitting element under control of the reset control line, to reset a potential of the first electrode of the light-emitting element.

A display device in some embodiments of the present disclosure includes the pixel circuit described above.

In a practical operation, the display device in some embodiments of the present disclosure may further include a display substrate, the first reset unit in the pixel circuit includes a first reset transistor, and the driving unit in the pixel circuit includes a driving transistor; the display device includes a gate metal layer, an active layer and a source-drain metal layer which are disposed on the display substrate, and an insulation layer disposed between the active layer and the source-drain metal layer; a pattern of the gate metal layer includes a reset control line and a gate electrode of the first reset transistor; the gate electrode of the first reset transistor is connected to the reset control line; a pattern of the source-drain metal layer includes the first voltage line, a source electrode of the first reset transistor, a drain electrode of the first reset transistor and a source electrode of the driving transistor; the source electrode of the first reset transistor is connected to the first voltage line, and the drain electrode of the first reset transistor is connected to the source electrode of the driving transistor; and the source electrode of the first reset transistor is connected to the active layer through a first via hole penetrating the insulation layer, and the drain electrode of the first reset transistor is connected to the active layer through a second via hole penetrating the insulation layer.

Compared with a display device in the related art, the first reset transistor is added in the pixel circuit of the display device according to some embodiments of the present disclosure, the gate electrode of the first reset transistor is connected to the reset control line, and the source electrode of the first reset transistor is connected to the first voltage line (the first voltage line may be the high voltage line that outputs the Vdd in a practical operation), and the drain electrode of the first reset transistor is connected to the source electrode of the driving transistor.

Figure 7:
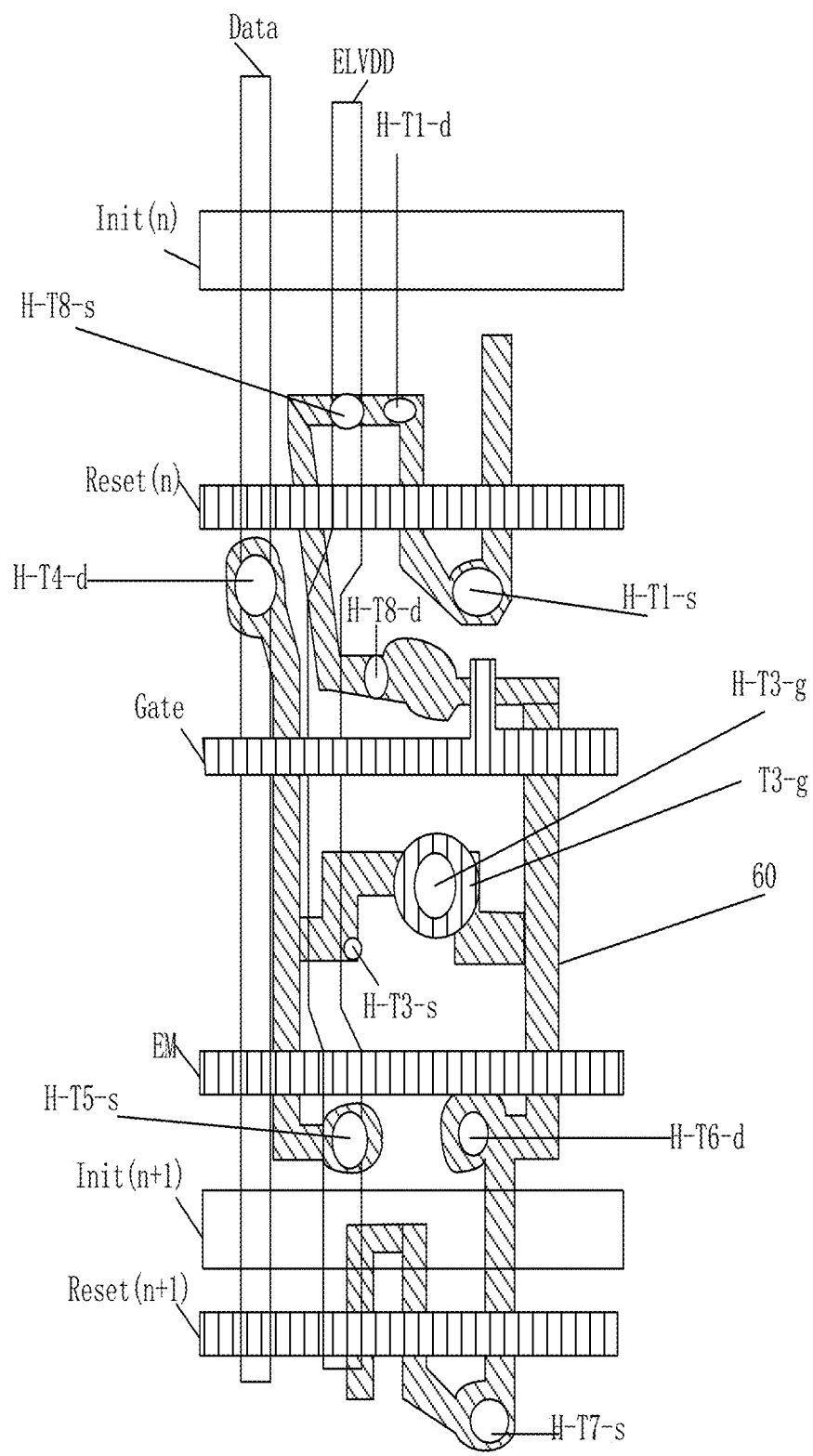
FIG. 7 is a schematic structural diagram of a pixel circuit in an nth row and an mth column included in a display device in some embodiments of the present disclosure.

FIG. 7 is a schematic structural diagram of a pixel circuit in an nth row and an mth column (a structure of the pixel circuit in the nth row and the mth column is shown in FIG. 6) in the display device of the present disclosure. FIG. 7 illustrates a first gate metal layer, a second gate metal layer, an active layer 60 and a source-drain metal layer disposed sequentially; m is a positive integer, and n is a positive integer larger than 1.

A first insulation layer (not shown in FIG. 7) is disposed between the first gate metal layer and the second gate metal layer, a gate insulation layer (not shown in FIG. 7) is disposed between the first gate metal layer and the active layer 60, and a second insulation layer (not shown in FIG. 7) is disposed between the source-drain metal layer and the second gate metal layer.

In FIG. 7, Init (n) denotes an initial voltage line in an nth row, Init(n+1) denotes an initial voltage line in the (n+1)th row, and both Init (n) and Init(n+1) output the initial voltage Vinit.

A pattern of the first gate metal layer includes a reset control line Reset(n) in an nth row, the gate line Gate, the light-emitting control line EM, a reset control line Reset(n+1) in the (n+1)th row, and gate electrodes of all transistors included in the pixel circuit in the nth row and the mth column.

A pattern of the second gate metal layer includes the initial voltage line Init (n) in the nth row and the initial voltage line Init(n+1) in the (n+1)th row.

In FIG. 7, T3-g denotes the gate electrode of the T3. The gate electrode of the T8, the gate electrode of the T1 and the gate electrode of the T7 are disposed successively from left to right at an intersection of the Reset(n) and the active layer 60. The gate electrode of the T4 and the gate electrode of the T2 are disposed successively from left to right at an intersection of the Gate and the active layer 60. The gate electrode of the T5 and the gate electrode of the T6 are disposed successively from left to right at an intersection of the EM and the active layer 60.

In FIG. 7, a pattern of the source-drain metal layer includes the data line Data, a high voltage line ELVDD, and the source electrodes and the drain electrodes of all the transistors included in the pixel circuit in the nth row and the mth column. Only via holes corresponding to the source electrodes and the drain electrodes are drawn in FIG. 7.

In FIG. 7, H-T1-s denotes a via hole corresponding to the source electrode of the T1, H-T1-d denotes a via hole corresponding to the drain electrode of the T1, H-T8-s denotes a via hole corresponding to the source electrode of the T8, H-T8-d denotes a via hole corresponding to the drain electrode of the T8, and H-T4-d denotes a via hole corresponding to the drain electrode of the T4, H-T3-g denotes a via hole corresponding to the gate electrode of the T3, H-T3-s is a via hole corresponding to the source electrode of the T3, and H-T5-s denotes a via hole corresponding to the source electrode of the T5, H-T6-d denotes a via hole corresponding to the source electrode of the T6, and H-T7-s denotes a via hole corresponding to the source electrode of the T7.

The source electrode of the T1 and the Init (n) are connected via a first connection line (not shown in FIG. 7), and the drain electrode of the T1 and gate electrode of the T3 are connected via a second connection line (not shown in FIG. 7). The drain electrode of the T6 is connected to the anode of the OLED (not shown in FIG. 7) via a third connection line (not shown in FIG. 7).

In the embodiment shown in FIG. 7, the drain electrode of the T1 is connected to H-T3-g via an SD (source-drain) wire, and H-T3-g is the via hole penetrating the gate insulation layer and connected to the gate electrode of the T3.

In a specific implementation, some differences in layout between some embodiments of the present disclosure and the related art are as follows. The high voltage on the ELVDD is written into the source electrode of the T8, and the drain electrode of the T8 is connected to the source electrode of the T3 via the SD (source-drain) wire, which is not shown in FIG. 7, and a U-shaped structure of the T1 is changed into an L-shaped structure.

In a specific implementation, the second reset unit in the pixel circuit includes a second reset transistor, a gate electrode of the driving transistor is connected to a drain electrode of the second reset transistor through a third via hole; and the source electrode of the driving transistor is connected to the active layer through a fourth via hole penetrating the insulation layer.

The third via hole is the via hole H-T3-g penetrating the gate insulation layer and connected to the gate electrode of the T3, the fourth via hole is the via hole H-T3-s corresponding to the source electrode of the driving transistor T3.

In a specific implementation, the second reset unit in the pixel circuit includes a second reset transistor, a source electrode of the second reset transistor is connected to the active layer through a fifth via hole penetrating the insulation layer, and a drain electrode of the second reset transistor is connected to the active layer through a sixth via hole penetrating the insulation layer.

The fifth via hole is the via hole H-T1-s corresponding to the source electrode of the second reset transistor T1, the sixth via hole is the via hole H-T1-d corresponding to the drain electrode of the second reset transistor T1.

In a specific implementation, the light-emitting control unit in the pixel circuit includes a first light-emitting control transistor and a second light-emitting control transistor, a source electrode of the first light-emitting control transistor is connected to the active layer through a seventh via hole penetrating the insulation layer, a drain electrode of the second light-emitting control transistor is connected to the active layer through an eighth via hole penetrating the insulation layer.

The seventh via hole is the via hole H-T5-s corresponding to the source electrode of the first light-emitting control transistor T5, the eighth via hole is the via hole H-T6-d corresponding to the drain electrode of the second light-emitting control transistor T6.

In a specific implementation, the driving control unit in the pixel circuit includes a first driving control transistor, a drain electrode of the first driving control transistor is connected to the active layer through a ninth via hole penetrating the insulation layer.

The ninth via hole is the via hole H-T4-d corresponding to the drain electrode of the first driving control transistor T4.

In a specific implementation, the second reset unit in the pixel circuit further includes a third reset transistor, a source electrode of the third reset transistor is connected to the active layer through a tenth via hole penetrating the insulation layer The tenth via hole is the via hole H-T7-s corresponding to the source electrode of the third reset transistor T7.

In a specific implementation, the second reset unit in the pixel circuit includes a second reset transistor and a third reset transistor, the gate electrode of the first reset transistor, a gate electrode of the second reset transistor and a gate electrode of the third reset transistor are disposed successively along a direction from the data line to the first voltage line at an intersection of the reset control line and the active layer.

As shown in FIG. 7, a gate electrode of the first reset transistor T8, a gate electrode of the second reset transistor T1 and a gate electrode of the third reset transistor T7 are disposed successively along the direction from the data line Data to the first voltage line ELVDD at an intersection of the reset control line Reset(n) and the active layer 60.

In a specific implementation, the driving control unit in the pixel circuit includes a first driving control transistor and a second driving control transistor, a gate electrode of the first driving control transistor and a gate electrode of the second driving control transistor are disposed successively along a direction from the data line to the first voltage line at an intersection of the gate line and the active layer.

As shown in FIG. 7, a gate electrode of the first driving control transistor T4 and a gate electrode of the second driving control transistor T2 are disposed successively along the direction from the data line Data to the first voltage line ELVDD at an intersection of the gate line Gate and the active layer 60.

In a specific implementation, the light-emitting control unit in the pixel circuit includes a first light-emitting control transistor and a second light-emitting control transistor, a gate electrode of the first light-emitting control transistor and a gate electrode of the second light-emitting control transistor are disposed successively along a direction from the data line to the first voltage line at an intersection of the light-emitting control line and the active layer.

As shown in FIG. 7, a gate electrode of the first light-emitting control transistor T5 and a gate electrode of the second light-emitting control transistor T6 are disposed successively along the direction from the data line Data to the first voltage line ELVDD at an intersection of the light-emitting control line EM and the active layer 60.

The display device in some embodiment of the present disclosure may be any product or component having a display function, such as a mobile phone, a tablet computer, a television set, a display, a notebook computer, a digital photo frame, or a navigator.

The above are optional embodiments of the present disclosure, it should be appreciated that, a person skilled in the art may make various modifications and improvements without departing from the principle of the present disclosure, and these modifications and improvements shall also fall within the scope of the present disclosure.

What is claimed is:

1. A pixel circuit, comprising a light-emitting device, a driving circuit, a light-emitting control circuit, a driving control circuit, an energy storage circuit, a first reset circuit and a second reset circuit, wherein, the first reset circuit is connected to a reset control line, a first terminal of the driving circuit and a first voltage line, and configured to write a first voltage output by the first voltage line into the first terminal of the driving circuit under control of the reset control line;

the second reset circuit is connected to the reset control line, a control terminal of the driving circuit and an initial voltage line, and configured to write an initial voltage output by the initial voltage line into the control terminal of the driving circuit under control of the reset control line;

the light-emitting control circuit is connected to a light-emitting control line, the first terminal of the driving circuit, a second terminal of the driving circuit, the first voltage line and a first electrode of the light-emitting device, and configured to conduct or disconnect a connection between the first terminal of the driving circuit and the first voltage line, and conduct or disconnect a connection between the second terminal of the driving circuit and the first electrode of the light-emitting device under control of the light-emitting control line; a second electrode of the light-emitting device is connected to a second voltage line;

the driving control circuit is connected to a gate line, a data line, the control terminal of the driving circuit, the first terminal of the driving circuit and the second terminal of the driving circuit, and configured to write a data voltage on the data line into the first terminal of the driving circuit, and conduct or disconnect a connection between the control terminal of the driving circuit and the second terminal of the driving circuit under control of the gate line;

a first terminal of the energy storage circuit is connected to the control terminal of the driving circuit, and a second terminal of the energy storage circuit is connected to the first voltage line, the energy storage circuit is configured to maintain a potential of the control terminal of the driving circuit; and the driving circuit is configured to drive the light-emitting device to emit light under control of the control terminal of the driving circuit.

2. The pixel circuit according to claim 1, wherein the first reset circuit comprises a first reset transistor;

a gate electrode of the first reset transistor is connected to the reset control line, a first electrode of the first reset transistor is connected to the first voltage line, and a second electrode of the first reset transistor is connected to the first terminal of the driving circuit.

3. The pixel circuit according to claim 1, wherein the second reset circuit comprises a second reset transistor;

a gate electrode of the second reset transistor is connected to the reset control line, a first electrode of the second reset transistor is connected to the control terminal of the driving circuit, and a second electrode of the second reset transistor is connected to the initial voltage line.

4. The pixel circuit according to claim 1, wherein the driving circuit comprises a driving transistor;

a gate electrode of the driving transistor is the control terminal of the driving circuit, a first electrode of the driving transistor is the first terminal of the driving circuit, and a second electrode of the driving transistor is the second terminal of the driving circuit.

5. The pixel circuit according to claim 1, wherein the light-emitting control circuit comprises a first light-emitting control transistor and a second light-emitting control transistor, a gate electrode of the first light-emitting control transistor is connected to the light-emitting control line, a first electrode of the first light-emitting control transistor is connected to the first voltage line, and a second electrode of the first light-emitting control transistor is connected to the first terminal of the driving circuit;

a gate electrode of the second light-emitting control transistor is connected to the light-emitting control line, a first electrode of the second light-emitting control transistor is connected to the second terminal of the driving circuit, and a second electrode of the second light-emitting control transistor is connected to the first electrode of the light-emitting device.

6. The pixel circuit of claim 1, wherein the energy storage circuit comprises a storage capacitor, a first terminal of the storage capacitor is connected to the control terminal of the driving circuit, and a second terminal of the storage capacitor is connected to the first voltage line.

7. The pixel circuit according to claim 1, wherein the light-emitting device comprises an organic light-emitting diode, an anode of the organic light-emitting diode is the first electrode of the light-emitting device, and a cathode of the organic light-emitting diode is the second electrode of the light-emitting device.

8. The pixel circuit according to claim 1, wherein the driving control circuit comprises a first driving control transistor and a second driving control transistor, a gate electrode of the first driving control transistor is connected to the gate line, a first electrode of the first driving control transistor is connected to the first terminal of the driving circuit, and a second electrode of the first driving control transistor is connected to the data line;

a gate electrode of the second driving control transistor is connected to the gate line, a first electrode of the second driving control transistor is connected to the control terminal of the driving circuit, and a second electrode of the second driving control transistor is connected to the second terminal of the driving circuit.

9. The pixel circuit according to claim 1, wherein the second reset circuit is further configured to write the initial voltage output by the initial voltage line into the first electrode of the light-emitting device under control of the reset control line.

10. The pixel circuit according to claim 9, wherein the second reset circuit further comprises a third reset transistor; a gate electrode of the third reset transistor is connected to the reset control line, a first electrode of the third reset transistor is connected to the first electrode of the light-emitting device, and a second electrode of the third reset transistor is connected to the initial voltage line.

11. A pixel circuit, comprising a light-emitting device, a storage capacitor, a driving transistor, a first reset transistor, a second reset transistor, a first light-emitting control transistor, a second light-emitting control transistor, a first driving control transistor and a second driving control transistor; wherein,
a gate electrode of the first reset transistor is connected to a reset control line, a first electrode of the first reset transistor is connected to a first voltage line, and a second electrode of the first reset transistor is connected to a first electrode of the driving transistor;
a gate electrode of the second reset transistor is connected to the reset control line, a first electrode of the second reset transistor is connected to a gate electrode of the driving transistor, and a second electrode of the second reset transistor is connected to an initial voltage line;
a gate electrode of the first light-emitting control transistor is connected to a light-emitting control line, a first electrode of the first light-emitting control transistor is connected to the first voltage line, and a second electrode of the first light-emitting control transistor is connected to the first electrode of the driving transistor;
a gate electrode of the second light-emitting control transistor is connected to the light-emitting control line, a first electrode of the second light-emitting control transistor is connected to a second electrode of the driving transistor, and a second electrode of the second light-emitting control transistor is connected to a first electrode of the light-emitting device; a second electrode of the light-emitting device is connected to a second voltage line;
a first terminal of the storage capacitor is connected to the gate electrode of the driving transistor, and a second terminal of the storage capacitor is connected to the first voltage line;
a gate electrode of the first driving control transistor is connected to a gate line, a first electrode of the first driving control transistor is connected to the first electrode of the driving transistor, and a second electrode of the first driving control transistor is connected to a data line; and
a gate electrode of the second driving control transistor is connected to the gate line, a first electrode of the second driving control transistor is connected to the gate electrode of the driving transistor, and a second electrode of the second driving control transistor is connected to the second electrode of the driving transistor.

12. The pixel circuit according to claim 11, further comprising a third reset transistor; a gate electrode of the third reset transistor is connected to the reset control line, a first electrode of the third reset transistor is connected to the first electrode of the light-emitting device, and a second electrode of the third reset transistor is connected to the initial voltage line.

13. A pixel driving method, applied to the pixel circuit according to claim 1, the pixel driving method comprising:
during a reset stage,
writing, by the first reset circuit, the first voltage output by the first voltage line into the first terminal of the driving circuit under control of the reset control line to reset a potential of the first terminal of the driving circuit, and
writing, by the second reset circuit, the initial voltage output by the initial voltage line into the control terminal of the driving circuit under control of the reset control line to reset the potential of the control terminal of the driving circuit.

14. The pixel driving method according to claim 13, wherein a display period comprises the reset stage, a driving control stage and a light-emitting stage which are sequentially set; the driving circuit comprises a driving transistor, a gate electrode of the driving transistor is the control terminal of the driving circuit, a first electrode of the driving transistor is the first terminal of the driving circuit, and a second electrode of the driving transistor is the second terminal of the driving circuit; the pixel driving method further comprises:
during the driving control stage,
writing, by the driving control circuit, a data voltage Vdata on the data line into the first electrode of the driving transistor under control of the gate line,
connecting, by the driving control circuit, the gate electrode of the driving transistor and the second electrode of the driving transistor to turn on the driving transistor,
charging the energy storage circuit via the first voltage output by the first voltage line to raise the potential of the gate electrode of the driving transistor until the potential of the gate electrode of the driving transistor is Vdata+Vth, and
turning off the driving transistor, Vth is a threshold voltage of the driving transistor;
during the light-emitting stage,
conducting, by the light-emitting control circuit, the connection between the first voltage line and the first electrode of the driving transistor under control of the light-emitting control line, and conducting the connection between the second electrode of the driving transistor and the first electrode of the light-emitting device; and
turning on the driving transistor to drive the light-emitting device to emit light.

15. The pixel driving method according to claim 14, further comprising: during the reset stage, writing the initial voltage output by the initial voltage line into the first electrode of the light-emitting device under control of the reset control line to reset a potential of the first electrode of the light-emitting device.

16. A display device, comprising the pixel circuit according to claim 1.

17. The display device according to claim 16, further comprising a display substrate, wherein the first reset circuit in the pixel circuit comprises a first reset transistor, and the driving circuit in the pixel circuit comprises a driving transistor;
the display device comprises a gate metal layer, an active layer and a source-drain metal layer which are disposed on the display substrate, and an insulation layer disposed between the active layer and the source-drain metal layer;
a pattern of the gate metal layer comprises a reset control line and a gate electrode of the first reset transistor; the gate electrode of the first reset transistor is connected to the reset control line;
a pattern of the source-drain metal layer comprises the first voltage line, a source electrode of the first reset transistor, a drain electrode of the first reset transistor and a source electrode of the driving transistor;

the source electrode of the first reset transistor is connected to the first voltage line, and the drain electrode of the first reset transistor is connected to the source electrode of the driving transistor; and the source electrode of the first reset transistor is connected to the active layer through a first via hole penetrating the insulation layer, and the drain electrode of the first reset transistor is connected to the active layer through a second via hole penetrating the insulation layer.

18. The display device according to claim 17, wherein the second reset circuit in the pixel circuit comprises a second reset transistor, a gate electrode of the driving transistor is connected to a drain electrode of the second reset transistor through a third via hole; and the source electrode of the driving transistor is connected to the active layer through a fourth via hole penetrating the insulation layer.

19. The display device according to claim 17, wherein the second reset circuit in the pixel circuit comprises a second reset transistor, a source electrode of the second reset transistor is connected to the active layer through a fifth via hole penetrating the insulation layer, and a drain electrode of the second reset transistor is connected to the active layer through a sixth via hole penetrating the insulation layer.

20. The display device according to claim 17, wherein the light-emitting control circuit in the pixel circuit comprises a first light-emitting control transistor and a second light-emitting control transistor, a source electrode of the first light-emitting control transistor is connected to the active layer through a seventh via hole penetrating the insulation layer, a drain electrode of the second light-emitting control transistor is connected to the active layer through an eighth via hole penetrating the insulation layer.

* * * * *